United States Patent [19]

Miyazaki et al.

[11] Patent Number: 4,766,379
[45] Date of Patent: Aug. 23, 1988

[54] METHOD FOR OBTAINING NUCLEAR MAGNETIC RESONANCE INFORMATION DATA

[75] Inventors: Toshiyuki Miyazaki; Tohru Yamamoto, both of Atsugi, Japan

[73] Assignee: Asahi Kasei Kogyo Kabushiki Kaisha, Osaka, Japan

[21] Appl. No.: 901,695

[22] Filed: Aug. 29, 1986

[30] Foreign Application Priority Data

Sep. 2, 1985 [JP] Japan .................................. 60-194621

[51] Int. Cl.$^4$ .......................................... G01R 33/20
[52] U.S. Cl. .................................................... 324/309
[58] Field of Search ............... 324/309, 310, 311, 312, 324/313, 314

[56] References Cited

U.S. PATENT DOCUMENTS

| 4,506,223 | 3/1985  | Bottomley et al. | 324/309 |
| 4,553,096 | 11/1985 | Randell          | 324/309 |
| 4,585,993 | 4/1986  | Bottomley        | 324/309 |
| 4,593,247 | 6/1986  | Glover           | 324/309 |
| 4,646,023 | 2/1987  | Young            | 324/309 |

OTHER PUBLICATIONS

Physics in Medicine and Biology, vol. 30, No. 4, Apr. 1985, pp. 341-344, A. Haase et al.
Journal of Physics E: Scientific Instruments, vol. 18, Mar. 1985, pp. 224-227, K. Sekihara.
L'Onde Electrique, vol. 65, No. 4, Jul.-Aug. 1985, pp. 70-83, A. Briguet et al.
Physics in Medicine and Biology, vol. 25, May 1980, pp. 751-756, W. A. Edelstein et al.
Radiology, vol. 153, Oct. 1984, pp. 189-194, W. T. Dixon.

*Primary Examiner*—Stewart J. Levy
*Assistant Examiner*—Kevin D. O'Shea
*Attorney, Agent, or Firm*—Sughrue, Mion, Zinn, Macpeak & Seas

[57] ABSTRACT

A main magnetic field is applied to a target to excite the nuclear spin of a chosen type of atoms in a selected slice of the target. Subsequently, first and second gradient fields, which are parallel to the main magnetic field noted above and the strengths of which vary in the directions of respective first and second crossing axes in the slice, are applied to the target for predetermined period of time. Then, a readout magnetic gradient field, which is parallel to the first gradient field, and the strength of which varies in the direction of the first axis, is applied to the target to detect a free induction signal from the target. The detection of the free induction signal is repeatedly performed with a plurality of different strengths of the first and second gradient fields, whereby NMR data containing chemical shift data is obtained from the slice of the target noted above.

12 Claims, 11 Drawing Sheets

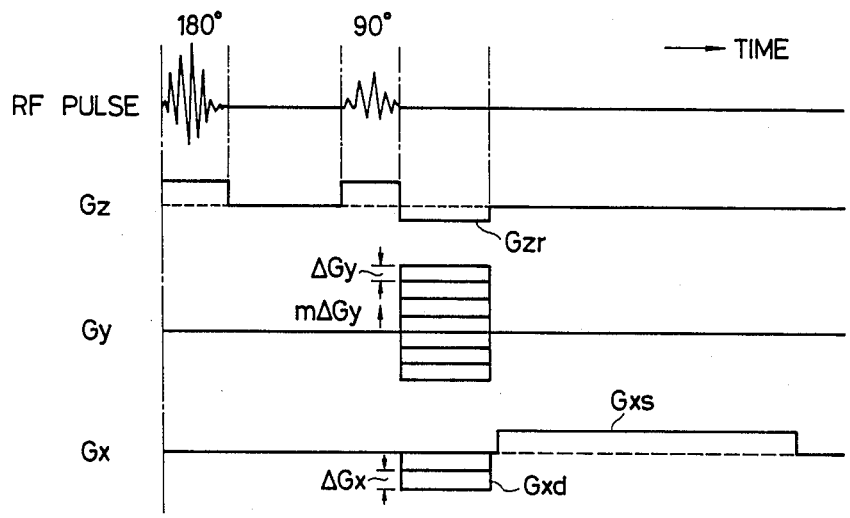
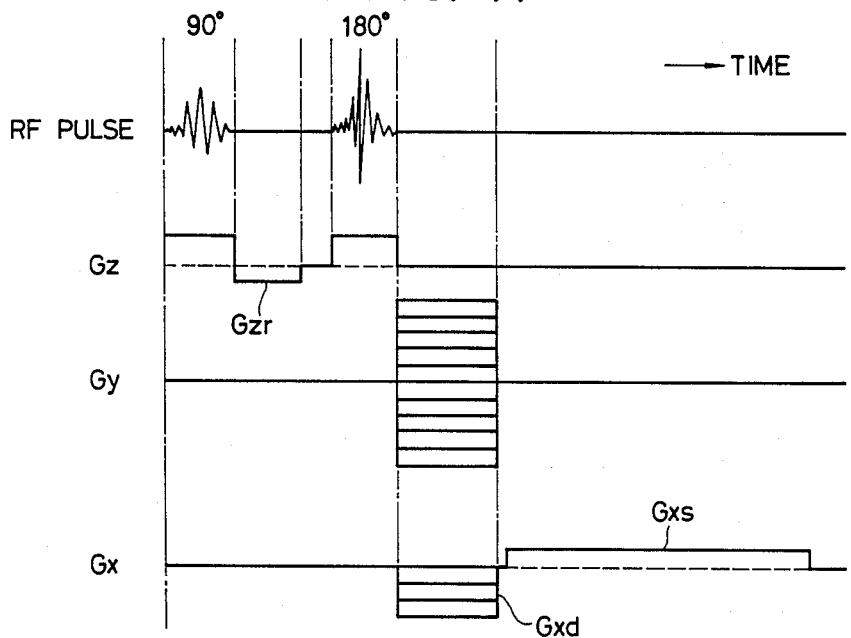

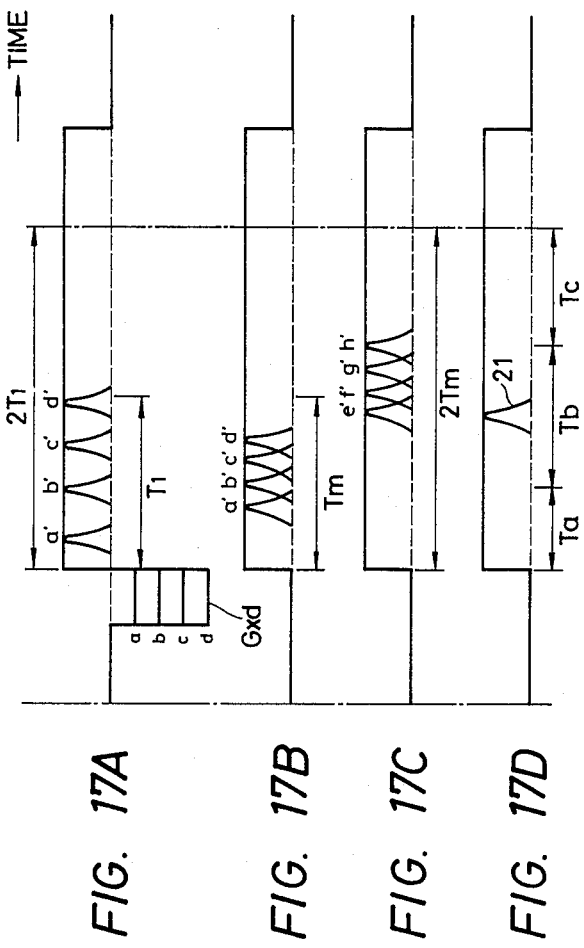

METHOD FOR OBTAINING NUCLEAR MAGNETIC RESONANCE INFORMATION DATA

BACKGROUND OF THE INVENTION

This invention relates to a method for obtaining nuclear magnetic resonance information data from a target, particularly a method for obtaining nuclear magnetic resonance information caused by chemical shift, which may be utilized for an apparatus for medical diagnosis.

A prior art apparatus for obtaining a space distribution of nuclear magnetic resonance (hereinafter referred to as NMR) spectrum data from a target and displaying the data as an image, has a construction shown in FIG. 1, for instance. Magnetic field generating means 11 generates a magnetic field Ho parallel to a Z-axis. Magnetic gradient field generating means 12 selectively generates magnetic gradient fields Gx, Gy and Gz parallel to the Z-axis and with the strength varying in the directions of X-, Y- and Z-axes, respectively. A target 13 is placed in a space, in which the magnetic field Ho and magnetic gradient fields Gx, Gy and Gz are selectively superimposed on one another. The axes, along which the strengths of the magnetic gradient fields Gx, Gy and Gz vary, need only cross one another and need not be perpendicular to one another.

A radio frequency (hereinafter referred to as RF) pulse current is caused through a coil 14 to apply an RF electromagnetic field to the target 13. An NMR signal which is generated from the target 13 at this time, is received by the coil 14. The received signal is fed to an RF signal transmitter/receiver 15 for amplification and detection. The detected signal is fed to an A/D converter 16 to be sampled for conversion into a digital signal which is in turn fed to a signal processor 17 consisting of an electronic computer. The signal processor 17 provides a processed NMR signal which is displayed as an image on a display 18.

Using the apparatus as described above, the NMR signal is collected by the so-called spin-warp method, for instance, in the following sequence.

To obtain the space distribution of NMR data of the target, a main magnetic field Ho which has a uniform magnetic intensity distribution in the Z-axis direction is applied to the target 13. At the same time, a Z-axis magnetic gradient field Gz with the strength thereof varying in the Z-axis direction (hereinafter referred to as Z-axis gradient field), as shown in FIG. 2, is applied. Further, a so-called 90° RF pulse is applied in parallel to the Y-axis direction normal to the Z-axis. Thus, the nuclei of a particular type of atoms, e.g., hydrogen atoms, in a slice of the target 13 intersecting a certain point on the Z-axis resonate to the 90° RF pulse under the given Z-axis main magnetic field Ho, and also their nuclear spins are tilted to lie in the X-Y plane to cause Lamor precession in the X-Y plane about the Z-axis, thus causing nuclear spin excitation in a selected slice 13a of the target 13. Subsequently, the Z-axis gradient field Gz is removed, and a Y-axis gradient field Gy is applied for a short period of time. As a result, the phase of the nuclear spins on lines intersecting the Y-axis at respective points in parallel with the X-axis are shifted from line to line according to the strengths of the Y-axis gradient field on the lines. Thereafter, an X-axis gradient field with the strength thereof varying in the X-axis direction is applied as a readout magnetic gradient field Gxs. A free induction signal which is obtained at this time is detected. The detected signal is then subjected to Fourier transformation with respect to time, whereby NRM data at each point on the X-axis is obtained as data at a different frequency. Usually, when the Y-axis gradient field Gy is provided for a short period of time an inverted Z-axis gradient field Gzr and an inverted X-axis gradient field Gxd are provided for rephasing and dephasing, respectively, in that period.

The above sequence of operations, which is labeled Sp in FIG. 3, is repeatedly performed for a necessary resolution by successively changing the gradient field strength of the Y-axis gradient field Gy. A series of the signals, which are obtained for the respective strengths of the Y-axis gradient field as a result of the Fourier transform noted above, are further subjected to Fourier transformation, thereby obtaining NMR data on Y-axis in the slice 13a. In other words, a two-dimensional Fourier transform is performed on a series of the signals which are obtained by repeatedly executing the sequence Sp shown in FIG. 3. In this way, the slice 13a is divided into, for instance, 256 by 256 pixels, and NMR data is available for each pixel. In this case, the sequence Sp noted above is performed 256 times. The repeated sequences Sp with various strengths of the Y-axis gradient field Gy are usually illustrated in a superimposed relation with one another on the same time axis as shown in FIG. 4.

It is well known that the frequency of free induction signal obtained from the same atom varies slightly depending on the state of chemical bonding thereof. This phenomenon is called chemical shift. For example, both water ($H_2O$) and lipid (either—$CH_2$—or—$CH_3$—) in the given slice contain hydrogen atoms, but the NMR frequency varies by 3.2 ppm between the hydrogen atom of water and that of lipid. Therefore, if the NMR frequencies of these two hydrogen atoms, one in water and the other in lipid, in a given slice are separately detected, it is possible to display as an image the distributions of water and lipid.

When obtaining NMR data from a living body, it is necessary to take the following into considerations.

(a) If the target is moved during the data collection, it deteriorates the obtained image quality. Therefore, the target should be held as stationary as possible. However, if the measurement is continued for a long time, it gives pain to the target, i.e., a patient for instance, thus frequently resulting in a movement of the target. For this reason, the measurement time is desirably as short as possible.

(b) To detect chemical shift information from the target, it is desirable that the existing NMR computer tomograph system (NMR-CT) can be utilized without alteration of its hardware structure. Further, it is desired that no excessive energy is projected onto the target.

United Kingdom Patent Application Publication GB No. 2,143,041 A discloses a method for obtaining NMR data including chemical shift data. In this method, as shown in FIG. 5, a slice of the target is excited by applying a gradient field Gz and a 90° RF pulse, and then Y- and X-axis gradient fields Gy and Gx are applied for a short period of time. Then, after a period τ a so-called 180° RF pulse is applied to the coil 14 shown in FIG. 1 to rotate the direction of the excited nuclear spins by 180 degrees. Subsequently, Z- and Y-axis gradient fields Gz and Gy are applied, and then X-axis gradient field Gx is applied as read-out field. The period $T_1$ from the excitation of the slice till the second application of the gradient fields Gzr and Gy, that is, till the application of the readout field Gxs, is set to be constant. The purpose of variation in strength of Y-axis gradient field Gy after the 180° RF pulse application is the same as that of the variation in strength of Y-axis gradient field Gy shown in FIG. 3. With respect to each strength of the Y-axis gradient field Gy the generation of the 180° RF pulse is shifted by a period $\Delta \tau$.

When the slice is excited by the 90° RF pulse, the directions, i.e., the phases, of the excited nuclear spins coincide with one another, and the detected free induction signal has the highest level. However, with the lapse of time the phases of the nuclear spins disperse to reduce the free induction signal level. When the 180° RF pulse is applied after a lapse of time $\tau$, the direction of each nuclear spin is inverted, that is, those spins with lagging phases relative to a reference are converted into the ones with leading phases, while those with leading phases are converted into the ones with lagging phases. If the dephasing gradient field Gxd is not applied, a gradually decaying free induction signal FI would be observed and, after application of the 180°-pulse, a gradually increasing spin echo (or so-called Hahn echo) signal SE, which reaches a maximum after a lapse of time since the 180°-pulse, between the application of the 90° RF pulse and the 180° RF pulse by $\Delta \tau$ while holding constant readout period $T_1$, the timing of reaching the maximum level of the spin echo signal SE would be caused to shift by $2\Delta \tau$ as indicated by the two-dotted chain line. However, the application of the dephasing gradient field Gxd causes rapid degeneration of the NMR signal and after a lapse of time $2\Delta \tau$, a gradient echo signal GE can be obtained. By varying the interval between the 90° pulse and the 180° pulse, the peak value of the GE signal will decrease in accordance with the level of the shifted spin echo signal SE'. Since the NMR frequency varies due to a chemical shift, the phase of Lamor precession of the nuclear spin varies to an extent corresponding to the frequency variation due to the chemical shift during the time $2\Delta \tau$. That is, after lapse of the time $2\Delta \tau$, the phases of spins having larger chemical shifts are in greater advance. For example, under conditions of Gy=0 and $\tau=\tau_1$, before application of readout gradient field Gxs the frequencies, represented by $\omega$ and $\Delta \omega$, and phases, represented by directions of arrows, of the nuclear spins of hydrogen atoms in CH$_2$ and hydrogen atoms in OH at the respective positions along the X-axis are as shown in FIG. 6A. As shown, the phase and frequency $\omega$ of the spin are identical with all the hydrogen atoms in CH$_2$ and also the phase and frequency $\omega + \Delta \omega$ of the spin are identical with all the hydrogen atoms in OH. When the readout gradient field Gxs is applied in this state, the nuclear spin frequencies of hydrogen atoms in CH$_2$ are $\omega$, $\omega + \Delta \omega$, $\omega + 2\Delta \omega$, ... and the nuclear spin frequencies of hydrogen atoms in OH are $\omega + \Delta \omega$, $\omega + 2\Delta \omega$, $\omega + 3\Delta \omega$, ... at X-axis positions of increasing values as shown in FIG. 6B. In other words, components of identical frequency are obtained at each two adjacent positions on the X-axis, so that it is impossible to discriminate the hydrogen atom of CH$_2$ and that of OH against one another.

Then, it is set such that $\tau=\tau_2$ and $\tau_2 < \tau_1$, and $2(\tau_1 - \tau_2)$ causes the phase of the hydrogen atom nuclear spin in OH to lead the phase of the hydrogen atom nuclear spin in CH$_2$ by $\pi$ as shown in FIG. 6C. When the readout gradient field Gxs is applied in this state, the frequencies of the hydrogen atom nuclear spins in CH$_2$ are $\omega$, $\omega + \Delta \omega$, $\omega + 2\Delta \omega$, ... while the frequencies of the hydrogen atom nuclear spins in OH are $\omega + \Delta \omega$, $\omega + 2\Delta \omega$, $\omega + 3\Delta \omega$, ... at successive X-axis positions as shown in FIG. 6D. Besides, the nuclear spins of the hydrogen atoms in CH$_2$ are in phase while the nuclear spins of the hydrogen atoms in OH are 180° out-of-phase with those in the case shown in FIG. 6B, respectively. Thus, by adding signals obtained in the states shown in FIGS. 6B and 6D, the nuclear spin data of hydrogen atoms in OH are cancelled each other, and only nuclear spin data of hydrogen atoms in CH$_2$ can be obtained. Also, by subtracting the signals obtained in the states shown in FIGS. 6B and 6D from one another, the nuclear spin data of hydrogen atoms in CH$_2$ can be cancelled, and only those of hydrogen atoms in OH can be obtained. This means that NMR data containing chemical shift data can be obtained in the sequence shown in FIG. 5. While two different kinds of chemical shift data are obtained in the above case, a large number of different kinds of chemical shift data can be obtained by increasing the number of times of causing the change in the interval $\tau$ between the 90° RF pulse and the 180° RF pulse.

Where 16 different kinds of chemical shift data are to be measured, the change in time $\tau$ by $\Delta \tau$ is caused 16 times. In this case, for 256 different strengths of the Y-axis gradient field, the measurement is carried out 256 by 16 times, and it requires a comparatively short time.

With the existing NMR-CT there have been proposed various sequences for obtaining NMR data, e.g., SR (saturation-recovery) sequence, SE (spin echo) sequence, IR (inversion recovery) sequence and multi-slice sequence where desired ones of the above sequences are appropriately combined. In the SE sequence, the signal level is maximum when time Te called echo time is Te=$2\tau$. Therefore, with NMR-CT using the SE sequence usually Te and $\tau$ are fixed so that the maximum signal level can be obtained at all time. The prior art method of obtaining chemical shift data shown in FIG. 5 utilizes the SE sequence. In this case, however, it is necessary to control the interval $\tau$ between 90° RF pulse and the 180° RF pulse. This means that the method shown in FIG. 5 can not be carried out by merely altering program with the existing NMR-CT which uses the SE sequence where $\tau$ is fixed. Rather, it is necessary to remodel hardware as well. In other words, the prior art method shown in FIG. 5 can not be readily applied to the existing NMR-CT.

SUMMARY OF THE INVENTION

An object of the present invention is to provide a method for obtaining NMR data containing chemical shift data, which requires a comparatively short measurement time and is readily applicable to the existing NMR-CT apparatus.

According to the invention, after nuclear spins of a particular type of atoms in a selected slice of the target have been excited, first and second magnetic gradient fields, which are parallel to a main field but vary in strength along respective axes crossing the axis of the main field, are applied for predetermined periods of time. The predetermined periods of the application of the first and second gradient fields need not be the same. Also, the first and second gradient fields need not be applied simultaneously. Subsequently, a readout magnetic gradient field is applied, which is parallel to the first magnetic gradient field and has strength variation along the axis of the first magnetic gradient field. At this time, a free induction signal emitted from the target is detected. Similar free induction signal detection is repeated while varying the strength of at least either one of the first and second magnetic gradient fields. The free induction signal detection is thus repeatedly performed for a predetermined number of combinations of different predetermined field strengths of the first and second magnetic gradient fields.

BRIEF DESCRIPTION OF THE DRAWINGS

FIG. 10 is a time chart showing a measurement sequence of the method according to the invention, in which a 180° RF pulse is applied before spin excitation;

FIG. 11 shows a measurement sequence of the method according to the invention, in which spin excitation is effected with a 180° RF pulse;

FIGS. 16A through 16D show an example of the Fourier transform of signals collected in the sequence shown in FIG. 15;

FIGS. 17A through 17D show other examples of the detection period according to the invention.

DETAILED DESCRIPTION OF THE PREFERRED EMBODIMENTS

Figure 4:
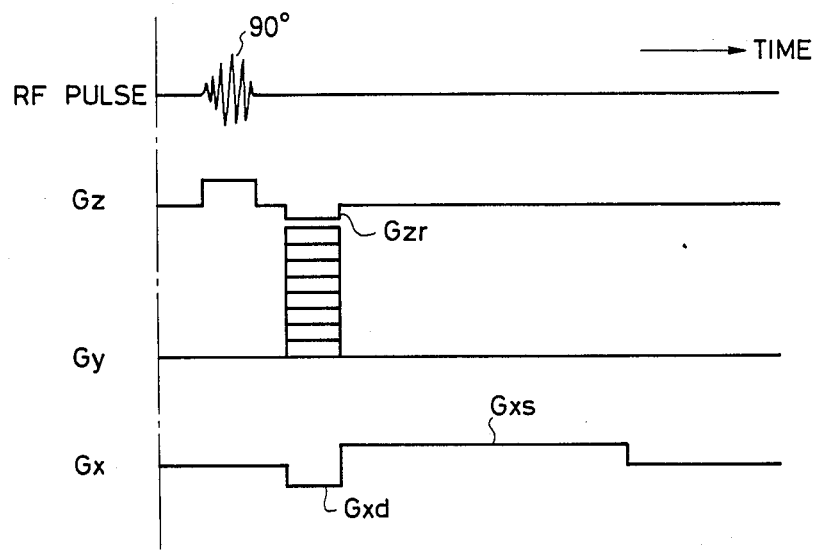
FIG. 4 is a time chart showing the sequences of FIG. 3 superimposed on one another.
Figure 7:
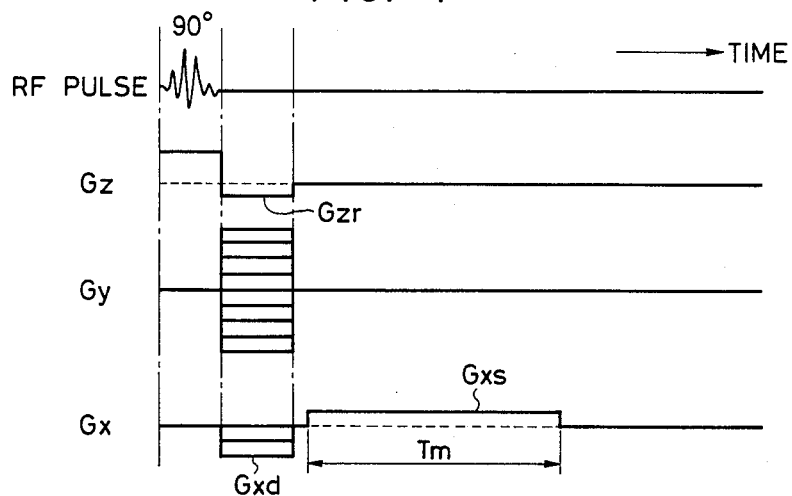
FIG. 7 is a time chart showing an example of measurement sequence according to the present invention.

FIG. 7 shows the measurement sequence in an embodiment of the method according to the invention. This sequence is the case where the invention is applied to the sequence shown in FIG. 4. This sequence is different from the sequence shown in FIG. 4 in that a different X-axis gradient field Gxd for dephasing purpose is applied for each short period during which Y-axis gradient field Gy is applied. Thus, where the strength of the Y-axis gradient field Gy is changed 256 times and the X-axis gradient field Gx for dephasing is changed 16 times, the measurement is carried out 256 by 16 times in total. The number of changes in the strength of the dephasing gradient field Gxd is determined according to the required chemical shift resolution.

Figure 8A:
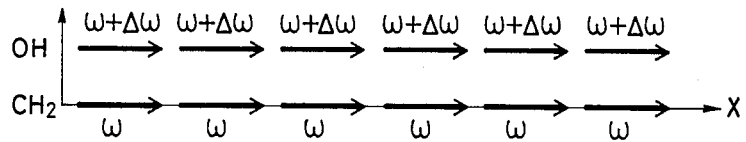
FIGS. 8A through 8D are diagrams showing an example of frequencies and phases of nuclear spins of hydrogen atoms in OH and $CH_2$ according to the present invention.
Figure 8B:
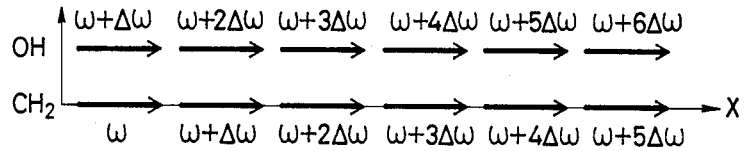
Figure 8C:
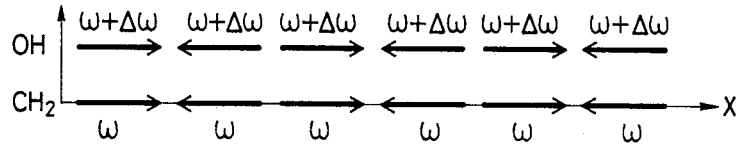
Figure 8D:
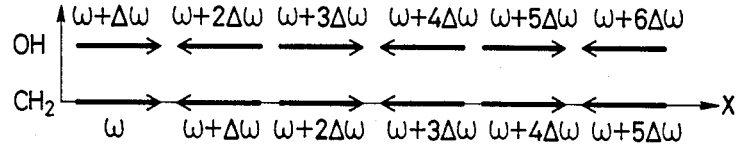
Figure 9:
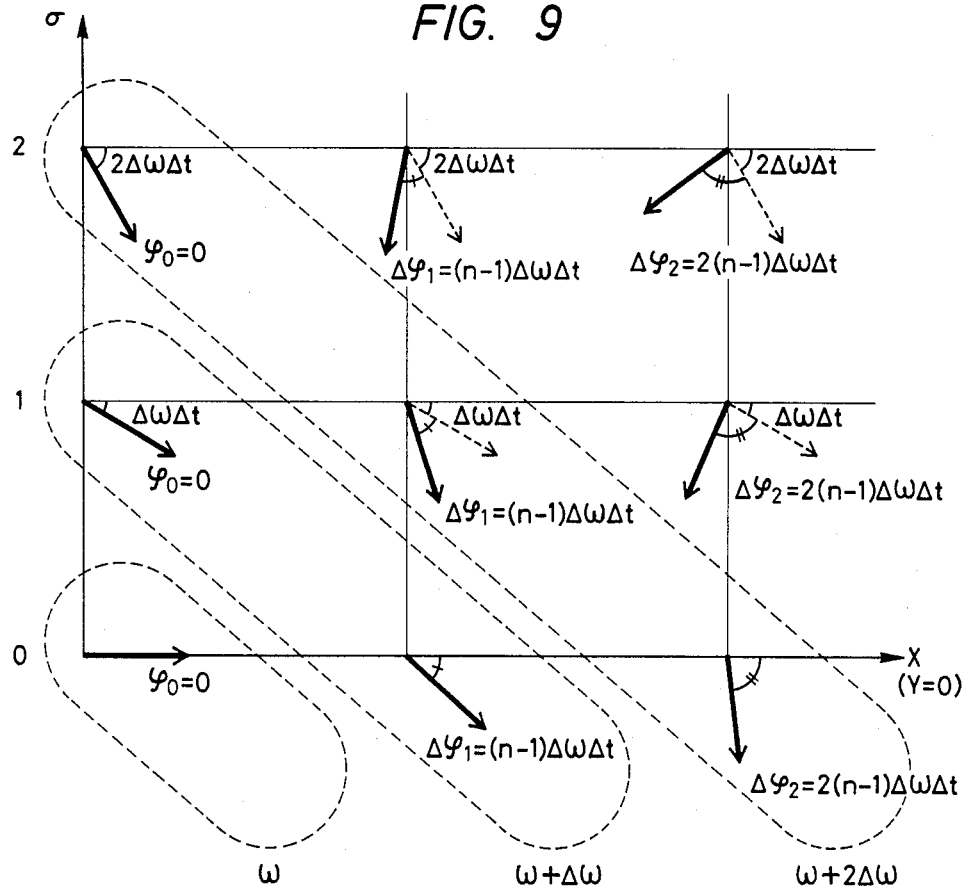
FIG. 9 is a diagram showing a typical example of changes in the initial phase due to a dephasing gradient field and changes in phase due to a readout magnetic gradient field in the method according to the invention.

More specifically, supposing that Gy=0 and Gxd=0 are set as the Y-axis gradient field and dephasing X-axis gradient field, and that the hydrogen atom nuclear spin of $CH_2$ and hydrogen atom nuclear spin of OH have frequencies of $\omega$ and $\omega+\Delta\omega$, respectively, and are in phase as shown in FIG. 8A immediately before application of the readout gradient field Gxs. Upon application of the readout gradient field Gxs, the $CH_2$ hydrogen atom nuclear spin frequency is changed to $\omega$, $\omega+\Delta\omega$, $\omega+2\Delta\omega$, ... while the OH hydrogen atom nuclear spin frequency is changed to $\omega+\Delta\omega$, $\omega+2\Delta\omega$, $\omega+3\Delta\omega$, ... along the X-axis, and both the hydrogen atom nuclear spings of $CH_2$ and OH are in phase at that moment as shown in FIG. 8B. After application of a 90° RF pulse in the next sequence, a dephasing X-axis gradient field $Gxd_1$ is applied for a given period while holding Gy=0. As a result, the initial phase of the hydrogen atom nuclear spin of $CH_2$ is shifted by 0, $\pi$, $2\pi$, $3\pi$, ... at respective X-axis points as shown in FIG. 8C. At this time, the field $Gxd_1$ has produced a shift in the initial phase of OH spin relative to the initial phase of the $CH_2$ spin due to the chemical shift. This phase shift, however, is very small and negligible. Thus, with the application of the dephasing gradient field $Gxd_1$ for a given period the initial phase of the OH hydrogen atom nuclear spin is also shifted by 0, $\pi$, $2\pi$, $3\pi$, ... at respective X-axis points. When the readout gradient field Gxs is applied in this state, the frequency of the $CH_2$ hydrogen atom nuclear spin is changed to $\omega$, $\omega+\Delta\omega$, $\omega+2\Delta\omega$, ... while the OH hydrogen atom nuclear spin frequency is changed to $\omega+\Delta\omega$, $\omega+2\Delta\omega$, $\omega+3\Delta\omega$, ... on the respective X-axis points while holding the initial phase relation noted above, as shown in FIG. 8D. Thus, by adding together corresponding frequency components obtained through Fourier transformation of the signals collected in the states shown in FIGS. 8B and 8D, the frequency components of the OH hydrogen atom nuclear spin $\omega+\Delta\omega$, $\omega+3\Delta\omega$, $\omega+5\Delta\omega$, ... and the frequency components of the $CH_2$ hydrogen atom nuclear spin $\omega$, $\omega+2\Delta\omega$, $\omega+4\Delta\omega$, ... can be detected. Also, by effecting subtraction between the corresponding frequency components obtained from the states shown in FIGS. 8B and 8D, the frequency components of the OH hydrogen atom nuclear spin $\omega$, $\omega+2\Delta\omega$, $\omega+4\Delta\omega$, ... and the frequency components of the $CH_2$ hydrogen atom nuclear spin $\omega+\Delta\omega$, $\omega+3\Delta\omega$, $\omega+5\Delta\omega$, ... can be detected. In the above way, it is possible to separate OH hydrogen atom nuclear spin components and $CH_2$ hydrogen atom nuclear spin components. Again in this case, the resolution of the chemical shift can be increased by increasing the number of times of change in the dephasing gradient field Gxd. For example, as shown in FIG. 9, with application of the dephasing gradient field Gxd with Gy=0, for $\sigma=0$ the phase of the nuclear spin is $\phi_0=0$, $\Delta\phi_1=(n-1)\Delta\omega\Delta t$, $\Delta\phi_2=2(n-1)\Delta\omega\Delta t, \ldots$ on X-axis points corresponding to respective strengths of the gradient field. For $\sigma=1$, a phase change $\Delta\omega\Delta t$ corresponding to a shift is added to phases $\Delta\phi_0, \Delta\phi_1, \Delta\phi_2, \ldots$ along the X-axis in case of $\sigma=0$. For $\sigma=2$, a phase change $2\Delta\omega\Delta t$ corresponding to a shift is added to the phases $\phi_0, \Delta\phi_1, \Delta\phi_2, \ldots$ on the X-axis in case of $\sigma=0$. Thus, a measurement as a group of $\omega, \omega+\Delta\omega, \omega+2\Delta\omega, \ldots$ is obtained with the readout gradient field Gxs.

Figure 5:
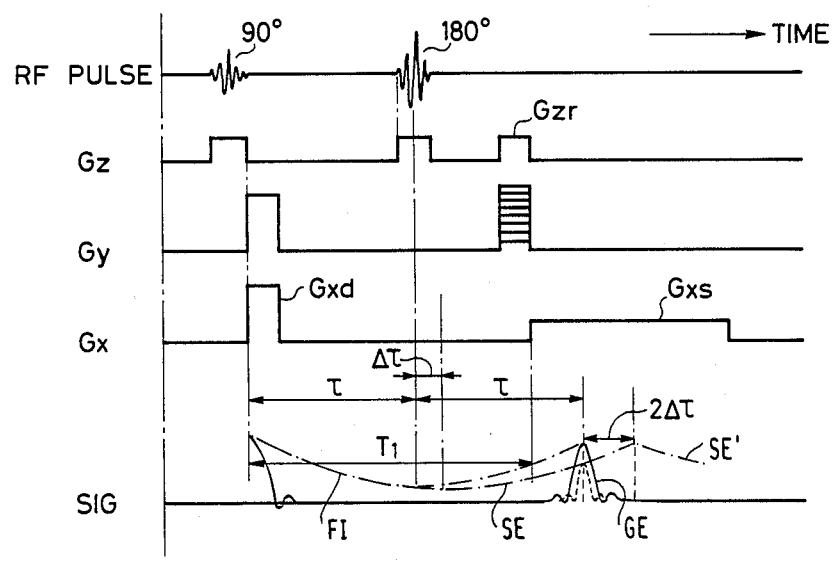
FIG. 5 is a time chart showing a measurement sequence of a prior art method for obtaining NMR data containing chemical shift data.

In the prior art method shown in FIG. 5, chemical shift data is obtained by giving a free induction signal a phase difference corresponding to the chemical shift by varying the instant of application of the 180° RF pulse, whereas according to the invention, chemical shift information is made separable by phase-coding, along the X-axis, the spins with the dephasing gradient field Gxd. Thus, the concept of the present invention completely differs from the prior art method.

Signal amplitudes of the chemical shift can be obtained from the signals collected in the measurement sequences shown in FIG. 7 by subjecting the collected signals to a three-dimensional Fourier transform. More specifically, denoting the strengths of the X- and Y-axis gradient fields Gx and Gy by $l\Delta Gx$ and $m\Delta Gy$, respectively, where m and l are integers, a signal So(l, m, t) (t being time) which is detected at the frequency of the RF pulse used for the nuclear spin excitation, is expressed as $$So(l,m,t) = \int_x \int_y \int_\sigma \rho(t,y,\sigma) f(t) \cdot \exp\{j[(l\cdot\gamma\cdot\Delta Gxd\cdot x + m\cdot\gamma\cdot\Delta Gy\cdot y)\Delta t + \sigma\Delta t + (\sigma + \gamma\cdot Gxd\cdot x)t]\}dxdyd\sigma \quad (1)$$

where $\rho(x, y, \sigma)$ is a quantity related to the signal amplitude of chemical shift $\sigma$ at position (x, y), and f(t) is a decay of signal due to such cause as spin-lattice relaxation and spin-spin relaxation of the atoms under observation, f(t) being a function which changes smoothly (i.e., the change is small) in the observed signal collection time. Therefore, the function can be treated as $f(t)=1$ in the following description. In the expression (1), $\gamma$ is the gyromagnetic ratio, j is $\sqrt{-1}$, and t is the time from the instant of application of the readout gradient field Gxs.

It is assumed that the distribution of nuclear spins in x-y-$\sigma$ space is discrete. Under this assumption, the observed signals can be dealt with as discrete finite data to readily obtain positional information in the x-y-$\sigma$ space through a discrete Fourier transform. Even when this assumption is made, the generality of principle can be maintained if sampling theorem and so forth are taken into adequate considerations for the discrete Fourier transform. By setting $$\left.\begin{array}{l} x = i\cdot\Delta x \\ y = j\cdot\Delta y \\ \sigma = k\cdot\Delta\sigma \\ t = n\cdot\Delta t' \end{array}\right\} \quad (2)$$

where i, j, k and n are integers, the equation (1) can be expressed as $$So(l,m,n) = \sum_{i,j,k} \rho(i,j,k)\cdot\exp\{j[l\cdot\gamma\cdot\Delta Gxd\cdot i\Delta x\Delta t + m\cdot\gamma\cdot\Delta Gy\cdot j\cdot\Delta y\Delta t + k\cdot\Delta\sigma\Delta t + (k\Delta\sigma + \gamma\cdot Gxs\cdot i\Delta x)n\Delta t']\} \quad (3)$$

Further, $$\left.\begin{array}{l} l\cdot\gamma\cdot\Delta Gxd\cdot\Delta x\Delta t \equiv 2\pi l/l_{max} \\ m\cdot\gamma\cdot\Delta Gy\cdot\Delta y\Delta t \equiv 2\pi m/m_{max} \\ n\cdot\Delta\sigma\Delta t' = n\cdot\gamma\cdot Gxs\cdot\Delta x\Delta t' \equiv 2\pi n/n_{max} \end{array}\right\} \quad (4)$$

where $l_{max}$, $m_{max}$ and $n_{max}$ are maximum values of l, m and n, respectively. Then we have $$So(l,m,n) = \sum_{i,j,k} \rho(i,j,k)\exp\left\{j\left[\frac{2\pi l}{l_{max}}\cdot i + \frac{2\pi m}{m_{max}}\cdot j + k\cdot\Delta\sigma\Delta t + \frac{2\pi n}{n_{max}}(k+i)\right]\right\} \quad (5)$$

A discrete Fourier transform of the equation (5) with respect to m, that is, the strengths of Y-axis gradient field Gy $$S_1(l,M = \text{MODE}(j,m_{max}),n) = \sum_{i,j} \rho(i,j,k)\exp\left\{j\left[\frac{2\pi l}{l_{max}}\cdot i + k\cdot\Delta\sigma\Delta t + \frac{2\pi n}{n_{max}}(k+i)\right]\right\} \quad (6)$$

where MODE(a,b) is a function representing the remainder of the division of a by b.

In the above way, positional information with respect to the Y-axis direction can be obtained. A discrete Fourier transform of the equation (6) with respect to n (i.e., with respect to time) can be expressed as $$S_2(l,M = \text{MODE}(j,m_{max}),N = \text{MODE}(k+i,n_{max})) = \sum_i \rho(i,j,k)\cdot\exp\left\{j\left[\frac{2\pi l}{l_{max}}i + k\cdot\Delta\sigma\Delta t\right]\right\} \quad (7)$$

Thus, it is possible to separate different frequency components in the x-$\sigma$ plane when the readout gradient field Gxs is applied. A discrete Fourier transform of the equation (7) with respect to l(i.e., with respect to a time series of strengths of the dephasing gradient field Gzd) can be expressed as $$S_3(L=\text{MODE}(i,l_{max}), M=\text{MODE}(j,m_{max}), N=\text{MODE}(k+i,n_{max}))=\rho(i,j,k)\exp\{j[k\Delta\sigma\Delta t]\} \quad (8)$$

The absolute value of the equation (8) is given as $$S'_3(\text{MODE}(i,l_{max}), \text{MODE}(j,m_{max}), \text{MODE}(k+i,n_{max}))=\rho(i,j,k) \quad (9)$$

Thus, we have $$\rho(i,j,k) = S'_3\{\text{MODE}(i,l_{max}), \text{MODE}(j,m_{max}), \text{MODE}(k+i,n_{max})\} \quad (10)$$

From the equation (10) it is possible to obtain the density $\rho(i,j,k)$ at all points of $n_{max} \times m_{max} \times l_{max}$ in the x-y-$\sigma$ space. Also, by displaying $\rho(i,j)$ with given k, it is possible to obtain an image of chemical shift, e.g., an image of the $CH_2$ hydrogen nuclear density or an image of the OH hydrogen nuclear density. For example, with a signal collection period Tm of 16 msec. and a number of sampling points of 256, the frequency resolution is given by $1/Tm = 62.5$ Hz. That is, the resolution of chemical shift in terms of frequency is 62.5 Hz. $\Delta Gxd$ is determined so that successive points on an axis in a space correspond to frequencies at intervals of 62.5 Hz and the nuclear spins at the respective points are given initial phase differences $2\pi l/16$, where $l = 0, 1, \ldots 15$. By so doing, each point in x-$\sigma$ plane is coded in terms of the frequency and initial phase difference given by $\Delta Gxd$. When the main magnetic field Ho is 2T, the NMR frequency of a proton is 85 MHz and therefore the frequency resolution 62.5 Hz is 0.73 ppm. In this case, encoding can be obtained in a zone with a chemical shift resolution (i.e., frequency resolution) of 0.73 ppm over the region of $0.73 \times 16$ ppm. With $l = 0$ to 15 and $m = 0$ to 255; signals at $256 \times 256 \times 16$ points can be obtained. By conducting a three-dimensional Fourier transformation on this data to obtain the amplitude of each component on the basis of the equation (8) and rearranging the result using the equation (10), it is possible to obtain a chemical shift image with $256 \times 256$ pixels at each of 16 points in observed chemical shift region of $0.73 \times 16$ ppm.

It is possible to obtain spin-lattice relaxation information by combining the sequence shown in FIG. 7 with the known 180° RF pulse technique as shown in FIG. 10. In this case, the 180° RF pulse and a Z-axis gradient field Gz are applied. After completion of the 180° pulse and gradient field Gz, the magnitudes of magnetic moments of the spins start decreasing due to the spin-lattice relaxation. The rate of decrease may differ depending on the environment of the hydrogen atoms to cause contrast in chemical shift image which is to be obtained. Then, like the case in FIG. 7, a 90° RF pulse and a Z-axis gradient field Gz are applied simultaneously and, thereafter, a Y-axis gradient field Gy for encoding with respect to the Y-axis direction and a rephasing Z-axis gradient field Gzr and a dephasing X-axis gradient field Gxd for encoding chemical shift are applied. Then, an X-axis readout gradient field Gxs is applied for encoding with respect to the X-axis direction while carrying out signal detection. Signal So(l, m, t) is obtained through measurement with respect to all the predetermined combinations of l and m of gradient strengths $m\Delta Gy(\Delta Gy$ being constant) of the Y-axis gradient field Gy and gradient strengths $l\Delta Gx(\Delta Gx$ being constant) of the dephasing X-gradient field Gxd.

FIG. 11 shows another sequence which is a combination of the invention with the known spin-echo technique. In this case, a Y-axis encoding gradient field Gy and a dephasing X-axis gradient field Gxd are applied after application of a 180° pulse.

Figure 12:
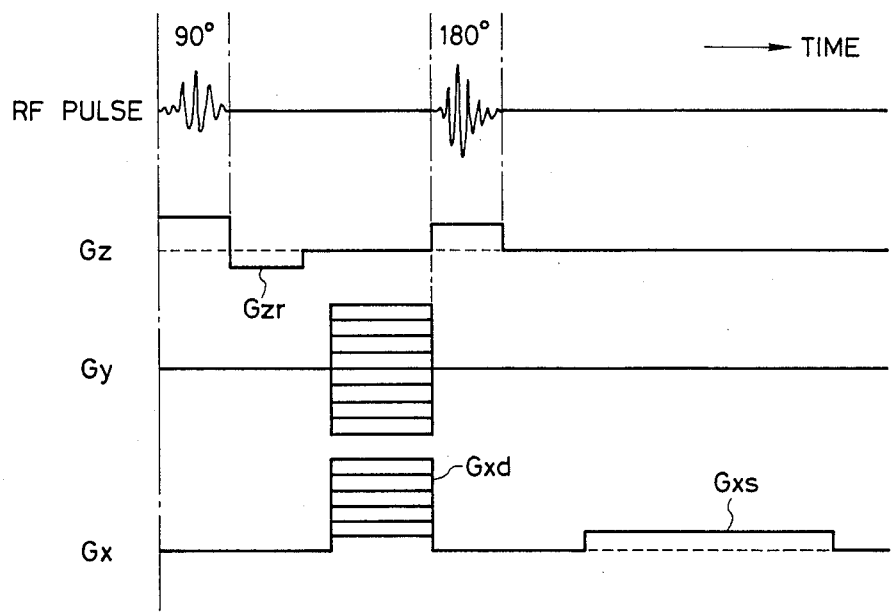
FIG. 12 is a time chart showing a measurement sequence of the method according to the invention, in which a 180° RF pulse is applied between an excitation pulse and a readout magnetic gradient field.

FIG. 12 shows a further sequence which can be used. In this case, a Y-axis encoding gradient field Gy and a dephasing gradient field Gxd are applied between the 90° pulse and 180° pulse.

In any of the above sequences in FIGS. 7, 10, 11 and 12, the Y-axis encoding gradient field Gy and dephasing X-axis gradient field Gxd need not be applied simultaneously. Also, their application times need not be equal.

Figure 13:
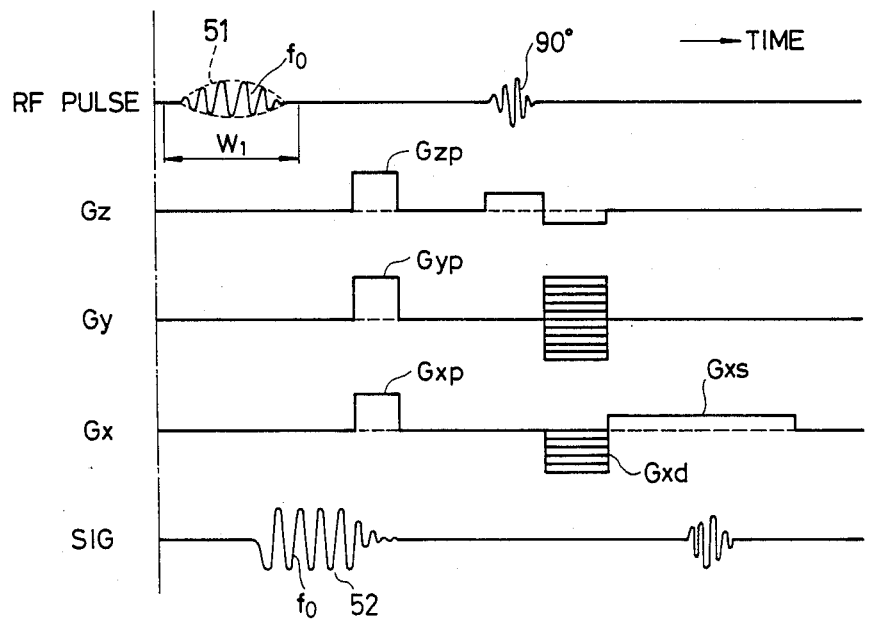
FIG. 13 is a time chart showing a measurement sequence according to the invention, in which a free induction signal caused by a particular type of nuclear spin is suppressed.

FIG. 13 shows a further combination of the invention with a known spin excitation technique. In this instance, prior to the sequence shown in FIG. 7, a RF pulse 51 called a CHESS pulse is applied to the target, and the nuclear spins of particular atoms are excited by appropriately selecting the frequency of the CHESS pulse 51 and pulse width $W_l$. Then, magnetic gradient fields Gzp, Gyp and Gxp are applied for a short period of time to spoil the phase of the Lamor precession of the excited nuclear spins so as to cause attenuation of free induction signal 52. Subsequently, the sequence shown in FIG. 7, for instance, is performed. In this way, signals from nuclear spins of above noted particular atoms can be suppressed while extracting signals from desired nuclear spins.

The collected NMR signals are usually processed through Fourier transformation as noted above. However, unless the amplitudes of the NMR signals are sufficiently small at the start and end of the NMR signal collection period Tm, an error will result from the Fourier transform. This error is called truncation error, and it appears as noise (i.e., artifact) when the NMR data is displayed as image.

Figure 14:
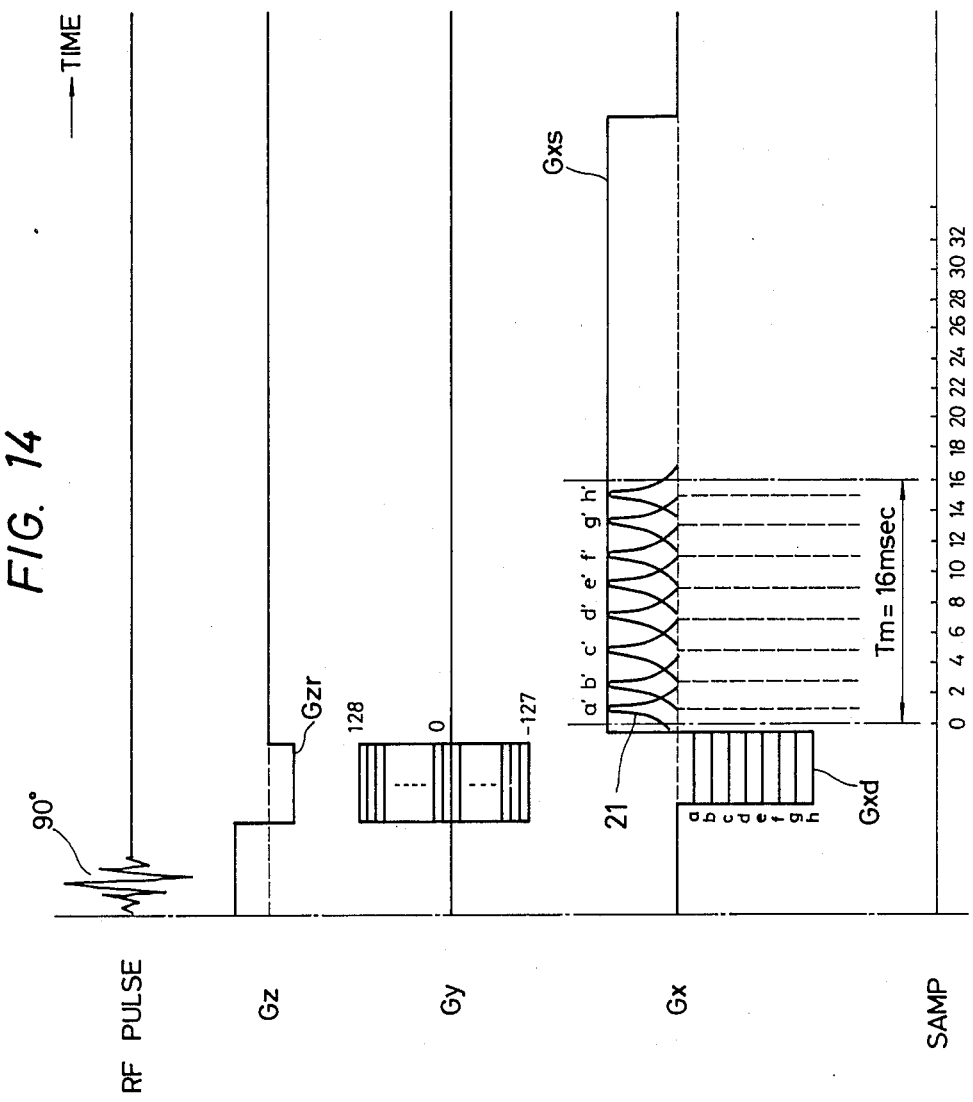
FIG. 14 is a time chart showing a measurement sequence of the method according to the invention, in which an ordinary length of free induction signal detection period is set.

In a further aspect, the intensity of the free induction signal is maximum at an instant when the time integral of the dephasing X-axis gradient field Gxd and time integral of the readout gradient field Gxs are equal. In the sequence shown in FIG. 7, the strength of the dephasing X-axis gradient field Gxd is progressively varied from a to h, as shown in FIG. 14. In this example, therefore, the time point (i.e., timing) of generation of the induction signal is shifted from a' to h' with the variation in the dephasing X-axis gradient field strength from a to h. Therefore, it may happen that at the opposite ends of the data collection period Tm, the free induction signals 21 are not sufficiently decayed and sample values thereat are fairly large. This increases truncation error at the time of the Fourier transform, the increased error being liable to appear as noise on the image.

Figure 15:
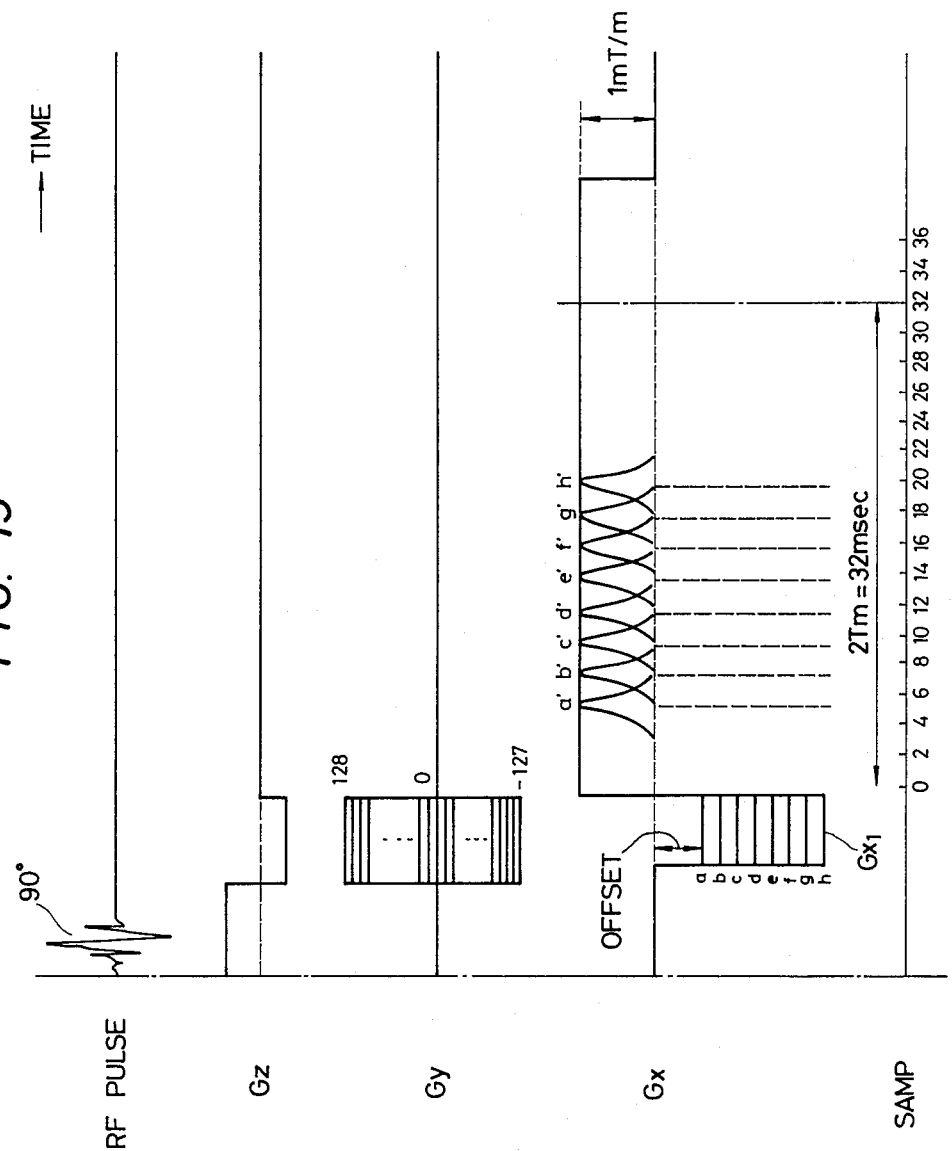
FIG. 15 is a time chart showing a measurement sequence of the method according to the invention, in which an extended detection period is set.

FIG. 15 shows a method for solving the above problems. More specifically, the X-axis gradient field Gxd is given an off-set to delay the position of appearance of free induction signal by approximately 4 msec. with respect to the case of the sequence shown in FIG. 4, and also the sampling time Tm and the number of sampling points for sampling the free induction signal are doubled. In other words, while in the case of FIG. 14 the sampling is carried out 256 times during a period of $Tm = 16$ msec., in the case of FIG. 15 the sampling is carried out 512 times in a sampling time of $2tm = 32$ msec. without altering the sampling frequency. The number of frequency components and the frequency resolution $\frac{1}{2}Tm$ Hz of the data thus obtained through Fourier transform with respect to time, are twice and one-half those frequency resolution obtainable with the sequence of FIG. 14, respectively. If desired, the same frequency resolution and sample numbers (i.e. an image size) as those obtainable with the sequence of FIG. 14 can be attained by performing a simple data processing on the result of the Fourier transform of the signal obtained in the sequence shown in FIG. 15 with respect to time.

Examples of the data processing schemes are given below. A complex data series as a result of the Fourier transform of the sample data obtained in the sequence shown in FIG. 15 with respect to time is represented as $$\rho\left(n\frac{\Delta\omega}{2}\right)$$

Figure 6A:
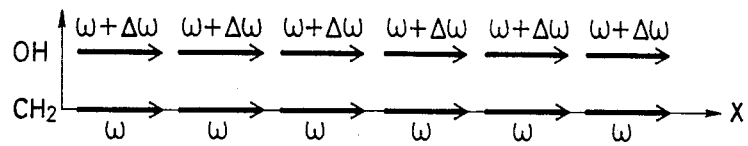
FIGS. 6A through 6D are diagrams showing an example of frequencies and phases of nuclear spins of hydrogen atoms in OH and $CH_2$ according to the prior art method.
Figure 6B:
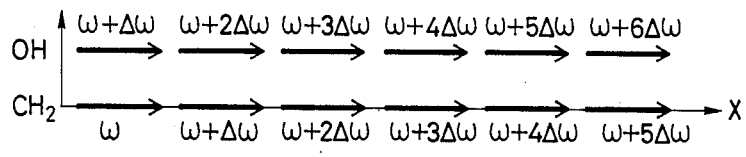
Figure 6C:
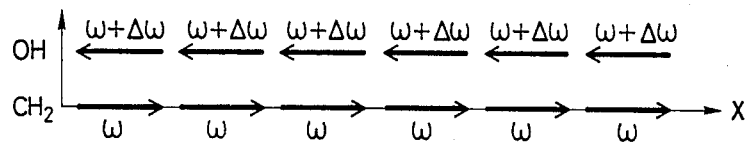
Figure 6D:
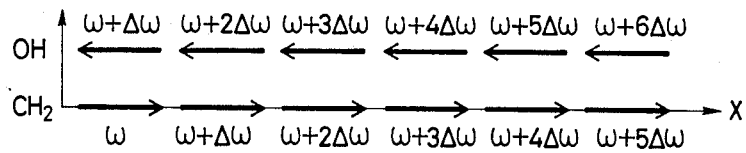

(shown in FIG. 6A) where n=0 to 511 and $\Delta\omega$ is the frequency resolution $1/Tm$ obtainable with the sequence shown in FIG. 14. The result of the Fourier transform of the data obtained in the sequence shown in FIG. 14 has frequency components of 0, $\Delta\omega$, $2\Delta\omega$, ..., $255\Delta\omega$, as shown in FIG. 16B. These frequency and phase components are obtained from $$\rho\left(n\frac{\Delta\omega}{2}\right)$$

(shown in FIG. 14A) through data processing. The data s obtained through the data processing is represented by $\rho'(m\Delta\omega)$ where m=0 to 255.

Data processing scheme 1

$$\rho'(m\Delta\omega) = \rho\left(2m\frac{\Delta\omega}{2}\right) \text{ where } m = 0 \text{ to } 255$$

In this example, the same frequency and phase components as those in the case of collecting data for time Tm are directly derived as shown in FIG. 16C.

Data processing scheme 2

$$\rho'(0) = \rho(0)$$

$$\rho'(m\Delta\omega) = \left\{\rho\left(2m\cdot\frac{\Delta\omega}{2}\right) + \rho\left([2m-1]\cdot\frac{\Delta\omega}{2}\right) \times 0.5 + \rho\left([2m+1]\cdot\frac{\Delta\omega}{2}\right) \times 0.5\right\} \times 0.5$$

for m = 1 to 255.

In this example, an average of the component $$\rho\left(2m\frac{\Delta\omega}{2}\right)$$

and immediately preceding and succeeding components $$\rho\left([2m-1]\frac{\Delta\omega}{2}\right) \text{ and } \rho\left([2m+1]\frac{\Delta\omega}{2}\right)$$

is produced as a component of frequency $m\Delta\omega$ (FIG. 16D). At this time, the individual averaged components are appropriately weighted. In this example, the component for $2m\Delta\omega/2$ is given a weight of 1, and the preceding and succeeding components are given a weight of 0.5. This weighting is not limitative.

After the data processing according to either scheme 1 or 2, a Fourier transformation is performed twice, and data consisting of absolute values of complex numbers is rearranged using the equation (10) to obtain chemical shift image data.

According to the invention, the free induction signal a' which is generated earliest need be of a sufficiently low sampling (detection) level only at its rising portion. This means that the strength a of the dephasing X-axis gradient field Gxd may be changed to b=2a, c=3a, ... as shown in FIG. 17A. Also, the free induction signal h' which is generated latest need be of a sufficiently low sampling (detection) level only at its falling portion. Therefore, it is possible to sample the free induction signals a' to d' only for the period Tm as shown in FIG. 17B, sample the free induction signals e' to h' for the period 2Tm as shown in FIG. 17C, add 256 "0"s after the former collected signals (256 samples) and Fourier transform the entirety of the samples of free induction signals a' to d' together with 256 "0"s and e' to h'. More generally, as shown in FIG. 17D, it is possible to effect sampling for a period Tb in the neighborhood where the free induction signal 21 is obtained and add a desired number of zeros as sample data in preceding and succeeding periods Ta and Tc. In the above way, it is possible to avoid sampling of substantially only noise components, thus improving the signal-to-noise ratio. Further, the sampling period is not limited to 2Tm, but it may be set to 3Tm, 4Tm, ... as well. Further, the extension of the sampling period as above is applicable to other sequences as well.

Figure 18:
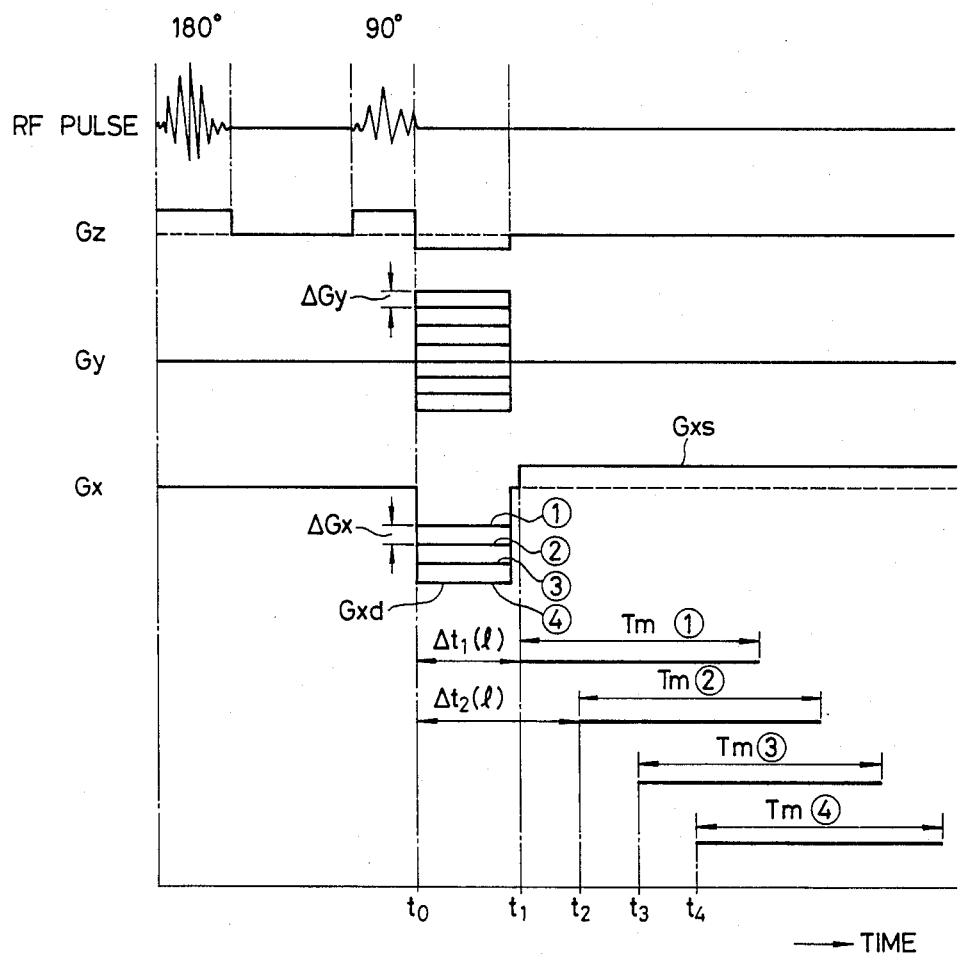
FIG. 18 is a timechart showing a measurement sequence of the method according to the invention, in which the detection period is shifted according to the strength of a dephasing magnetic gradient field.

FIG. 18 shows a sequence which is effective for solving the problem of generation of the free induction signal at an end portion of the sampling period Tm. More specifically, every time the strength of the dephasing gradient field Gxd is changed, the start point ti (i=1, 2, ...) of the detection period Tm is shifted under such condition that the difference in amplitude of the free induction signals at the opposite ends of the detection period Tm may not substantially cause deterioration of image quality.

Denoting the time, by which the start point is delayed, by $\Delta ti$, the equation (1) representing the received signal detection output is changed to be $$So(l,m,t,\Delta ti) = \int_x \int_y \int_\sigma \rho(t,y,\sigma)f(t)\cdot\exp\{j[(l\cdot\gamma\cdot\Delta Gxd\cdot x + m\cdot\gamma\cdot\Delta Gy)\Delta t + \sigma\cdot\Delta t + (\sigma+\gamma\cdot Gxd\cdot x)(t+\Delta ti)]\}dx\,dy\,d\sigma \quad (11)$$

A discrete Fourier transform of the equation (11) with respect to m and n gives $$S_2(l,M = \text{MODE}(j,m_{max}), N = \text{MODE}(k + i, n_{max}), \Delta ti) = \quad (12)$$

$$\sum_i \rho(i,j,k) \cdot$$

$$\exp\left\{j\left[\frac{2\pi l}{l_{max}}\cdot i + k\cdot\Delta\sigma\Delta t + (k+i)\cdot\frac{\Delta ti}{\Delta t'}\cdot\frac{2\pi}{n_{max}}\right]\right\}$$

Multiplification of the equation (12) by $\exp\{j[-(k+i)(\Delta ti/\Delta t')(2\pi/n_{max})]\}$ gives $$S'_2(l,M = \text{MODE}(j,m_{max}), N = \text{MODE}(k + i, n_{max})) = \quad (13)$$

$$S_2(l,M = \text{MODE}(j,m_{max}), N = \text{MODE}(k + i, n_{max}),\Delta ti) \times$$

$$\exp\left\{j\left[-(k+i)\cdot\frac{\Delta ti}{\Delta t'}\cdot\frac{2\pi}{n_{max}}\right]\right\}=$$

$$\sum_i \rho(i,j,k) \cdot \exp\left\{ j\left[ \frac{2\pi l}{l_{max}} \cdot i + k\Delta\sigma\Delta t \right] \right\}$$

In the equation (13), the term $(k+i)(\Delta ti/\Delta t')$ $(2\pi/n_{max})$ in the equation (12) representing the phase change component due to the delay time $\Delta ti$ has been removed. Since $\Delta ti$ is a preset value and $(k+i)$ is each component obtained as a result of the Fourier transform, the value to be multiplied with the equation (12) as mentioned above can be obtained. A Fourier transform of the equation (13) is further carried out in the manner as in the above case to obtain $$S_3(L=MODE(i,l_{max}), M=MODE(j,m_{max}),$$
$$N=MODE(k=i,n_{max}))=\rho(i,j,k)\cdot\exp\{j[k\Delta\sigma\Delta t]\} \quad (14)$$

The absolute value of the equation (14) is given as $$S_3(L=MODE(i,l_{max}), M=MODE(j,m_{max}),$$
$$N=MODE(k+i,n_{max}))=\rho(i,j,k) \quad (15)$$

As has been described in the foregoing, the initial phase of the free induction signal is controlled according to the chemical shift by altering the strength of the dephasing gradient field, that is, chemical shift data is encoded in terms of phase. Thus, it is possible to reduce the overall necessary data collection time. Further, since the existing NMR-CT is constructed such that it is possible to set the strength of the dephasing gradient field, it is possible to obtain NMR signal containing chemical shift data without altering the hardware construction of the existing NMR-CT but with slight software alteration.

Further, according to the invention, it is possible to employ a measurement sequence which does not require any 180° RF pulse, allowing to avoid from application of a high energy of such pulse to a living body.

Figure 1:
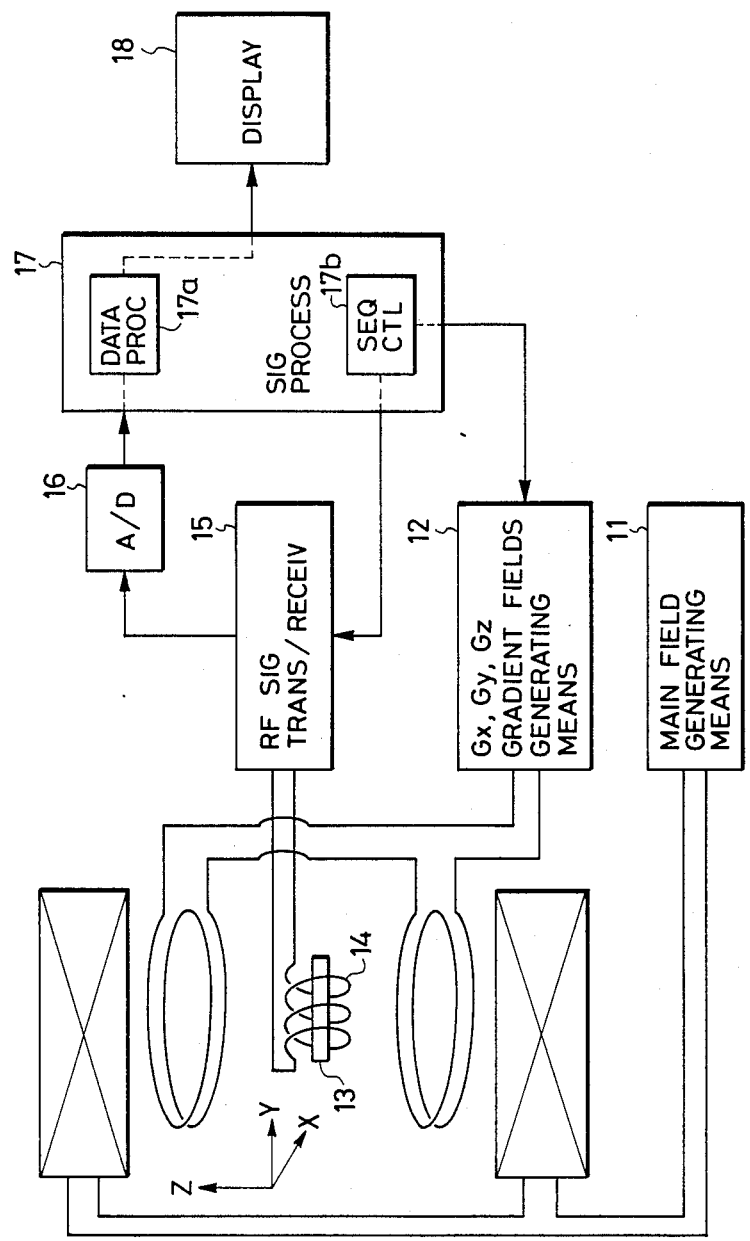
FIG. 1 is a block diagram showing a general construction of prior art NMR-CT.
Figure 2:
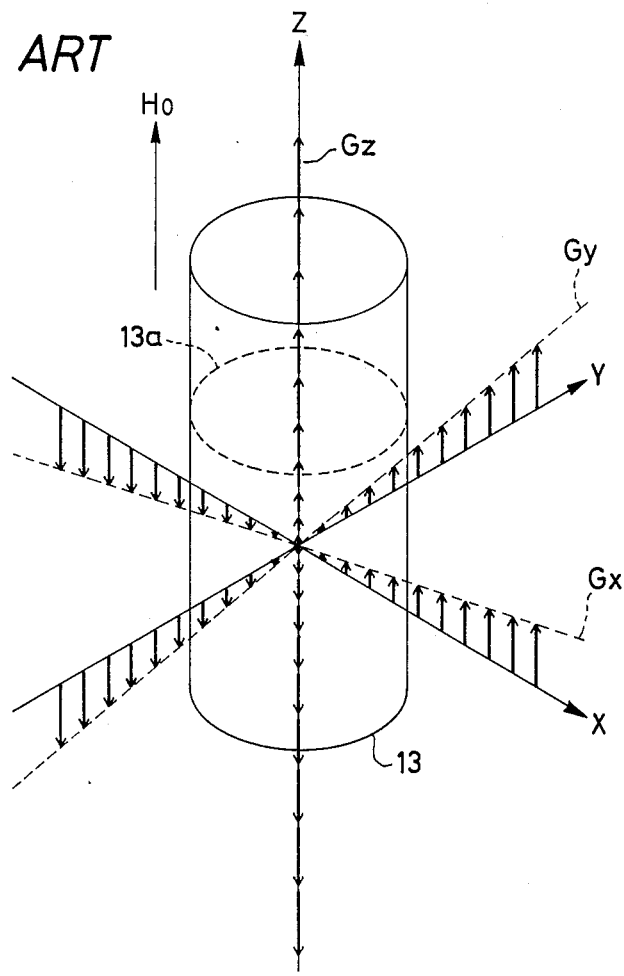
FIG. 2 is a view showing the relationship among a target 13, a selected slice 13a thereof, direction of a main magnetic field Ho and magnetic gradient fields Gz, Gx, and Gy.
Figure 3:
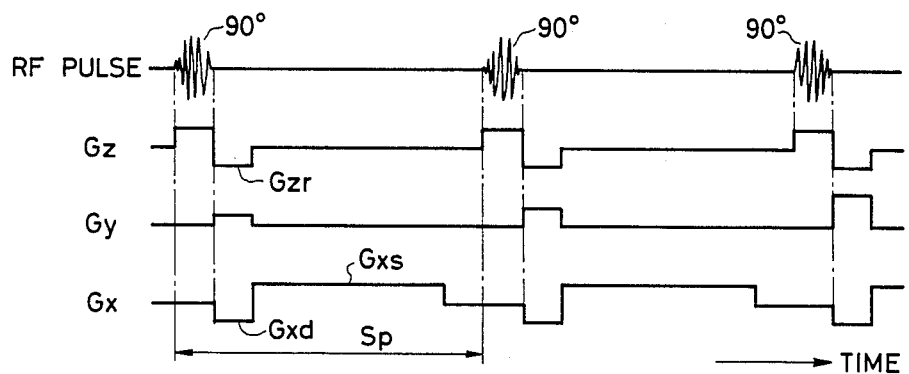
FIG. 3 is a time chart showing repeated measurement sequences according to the prior art spin-warp method.

The various processings described above are performed by a data processing section 17a in the signal processor 17 shown in FIG. 1, and two-dimensional image data obtained through these processings is displayed on the display 18. A sequence control section 17b in the signal processor 17 determines a sequence to be performed. According to the determined sequence, signals for performing the sequence are supplied to the gradient field generating means 12 and the RF signal transmitter/receiver 15.

What is claimed is:

1. A method for obtaining nuclear magnetic resonance information data containing chemical shift data from a selected slice of a target, comprising the steps of:
    placing said target in a main magnetic field and causing nuclear spin excitation of a selected type of atoms in said selected target slice defined in said magnetic field;
    applying to said target for a predetermined period of time first and second magnetic gradient fields parallel to said main magnetic field and having respective strengths varying along first and second axes crossing each other in said slice;
    subsequently applying to said target a readout magnetic gradient field parallel to said first magnetic gradient field and varying in strength along said first axis, to thereby encode spatial information in frequency along said first axis;
    detecting, in the presence of said readout magnetic gradient field, a free induction signal from said target after the lapse of a substantially constant period of time from said nuclear spin excitation;
    repeating a sequence of the foregoing steps a predetermined number of times while varying for each sequence the strength of said second magnetic gradient field, to thereby encode spatial information in phase along said second axis; and
    repeating at least once a series of said predetermined number of sequences while varying for each series the gradient field strength of said magnetic gradient field, to thereby encode chemical shift information in phase.

2. The method for obtaining nuclear magnetic resonance information data according to claim 1, wherein the strength of said first magnetic gradient field is selected such that a rising portion of one of the free induction signals nearest to a cutoff of said first magnetic gradient field is substantially zero at the start of the free induction signal detection, and the period of said free induction signal detection is set to be longer than an interval $T_1$ which is the inverse of a desired chemical shift resolution $1/T_1$ such that a detected value corresponding to a falling portion one of the free induction signal remotest from a cutoff of said first magnetic gradient field has a sufficiently small value at the end of the free induction signal detection.

3. The method for obtaining nuclear magnetic resonance information data according to claim 2, wherein the period of said free induction signal detection is set to $2T_1$; a Fourier transform is performed on a detected free induction signal sample series; frequency components $m\Delta\omega$ for $m=0, 1, 2, \ldots$ are derived from the frequency components $m\Delta\omega/2$, where $m=0, 2, 4, \ldots$, obtained as a result of said Fourier transform; and a two-dimensional Fourier transform is performed on said derived frequency components with respect to the strengths of said first and second magnetic gradient fields to thereby separate each chemical shift data.

4. The method for obtaining nuclear magnetic resonance information data according to claim 2, wherein the period of said free induction signal detection is set to $2T_1$; a Fourier transform is performed on a detected free induction signal sample series; data $\rho(0)$ and $$\rho'(m\Delta\omega) = W_1\left( \rho\left( 2m \cdot \frac{\Delta\omega}{2} \right) + \right.$$

$$\left. W_2\rho\left( [2m-1] \cdot \frac{\Delta\omega}{2} \right) + W_3\rho\left( [2m+1] \cdot \frac{\Delta\omega}{2} \right) \right)$$

for $m=1, 2, 3, \ldots$, where $W_1$, $W_2$ and $W_3$ being weighting values, are derived from a data series $$\rho(0), \rho\left(\frac{\Delta\omega}{2}\right), \rho\left(\frac{2\Delta\omega}{2}\right), \rho\left(\frac{3\Delta\omega}{2}\right),$$

... obtained as a result of said Fourier transform; and a two-dimensional Fourier transform is performed on said derived data with respect to the strengths of said first and second magnetic gradient fields to thereby separate each chemical shift data.

5. The method for obtaining nuclear magnetic resonance information data according to claim 1, wherein the period of detection of each free induction signal from said target is set such that the difference between the detected values at the start and end of said detection period is substantially zero.

6. The method for obtaining nuclear magnetic resonance information data according to claim 1, wherein the detected values at the start and end of said detection period are made to be substantially zero.

7. The method for obtaining nuclear magnetic resonance information data according to claim 1, 2 or 5, wherein said first magnetic gradient field is opposite in direction to said readout magnetic gradient field.

8. The method for obtaining nuclear magnetic resonance information data according to claim 1, 2 or 5, wherein said first magnetic gradient field has the same direction as said readout magnetic gradient field and a 180° pulse is applied to said target between the application of said first and second magnetic gradient fields and said readou magnetic gradient field.

9. The method for obtaining nuclear magnetic resonance information data according to claim 1, 2 or 5, wherein each chemical shift data is separated by effecting a three-dimensional Fourier transform of detected free induction signal with respect to sample series thereof, and strength series of said first and second magnetic gradient fields.

10. The method for obtaining nuclear magnetic resonance information data according to claim 1, wherein the step for causing nuclear spin excitation includes a step for simultaneously applying a 180° pulse and a slice selection gradient field to said target and a step for applying, after a fixed interval from the application of said 180° pulse, a 90° pulse to said target simultaneously with application of the slice selection gradient field.

11. The method for obtaining nuclear magnetic resonance information data according to claim 1, wherein the step for causing nuclear spin excitation includes a step for simultaneously applying a 90° pulse and a slice selection gradient field to said target and a step for applying, after a fixed interval from the application of said 90° pulse, a 180° pulse to said target simultaneously with application of the slice selection gradient field.

12. The method for obtaining nuclear magnetic resonance information data according to claim 1, wherein the step for causing nuclear spin excitation includes a step for applying a CHESS pulse to said target for a given period, a step for applying spoiling gradient fields and a step for simultaneously applying a 90° pulse and a slice selection gradient field to said target.

* * * * *